United States Patent
Moffatt et al.

(10) Patent No.: US 9,595,459 B2
(45) Date of Patent: **\*Mar. 14, 2017**

(54) MANAGING THERMAL BUDGET IN ANNEALING OF SUBSTRATES

(71) Applicant: Applied Materials, Inc., Santa Clara, CA (US)

(72) Inventors: Stephen Moffatt, St. Brelade (JE); Abhilash J. Mayur, Salinas, CA (US); Sundar Ramamurthy, Fremont, CA (US); Joseph M. Ranish, San Jose, CA (US); Aaron Muir Hunter, Santa Cruz, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/832,564

(22) Filed: Aug. 21, 2015

(65) Prior Publication Data
US 2015/0357215 A1    Dec. 10, 2015

Related U.S. Application Data

(63) Continuation of application No. 14/229,238, filed on Mar. 28, 2014, now Pat. No. 9,114,479, which is a
(Continued)

(51) Int. Cl.
*H01L 21/67* (2006.01)
*B23K 26/06* (2014.01)
(Continued)

(52) U.S. Cl.
CPC .... *H01L 21/67115* (2013.01); *B23K 26/0042* (2013.01); *B23K 26/064* (2015.10);
(Continued)

(58) Field of Classification Search
CPC ............... H01L 21/67115; H01L 21/67248
See application file for complete search history.

(56) References Cited

U.S. PATENT DOCUMENTS 6,187,616 B1    2/2001  Gyoda
6,638,800 B1   10/2003  Ishihara et al.
(Continued)

FOREIGN PATENT DOCUMENTS

EP      009186 A1    4/1980
JP    58106836 A     6/1983
(Continued)

OTHER PUBLICATIONS

International Search Report and Written Opinion of the International Searching Authority mailed Feb. 16, 2010 in PCT/US2009/055838.
(Continued)

*Primary Examiner* — Jamie C Niesz
(74) *Attorney, Agent, or Firm* — Patterson & Sheridan, LLP

(57) ABSTRACT

A method and apparatus are provided for treating a substrate. The substrate is positioned on a support in a thermal treatment chamber. Electromagnetic radiation is directed toward the substrate to anneal a portion of the substrate. Other electromagnetic radiation is directed toward the substrate to preheat a portion of the substrate. The preheating reduces thermal stresses at the boundary between the preheat region and the anneal region. Any number of anneal and preheat regions are contemplated, with varying shapes and temperature profiles, as needed for specific embodiments. Any convenient source of electromagnetic radiation may be used, such as lasers, heat lamps, white light lamps, or flash lamps.

20 Claims, 11 Drawing Sheets

Related U.S. Application Data continuation of application No. 12/212,157, filed on Sep. 17, 2008, now abandoned.

(51) Int. Cl.
*B23K 26/00* (2014.01)
*B23K 26/08* (2014.01)
*F27B 17/00* (2006.01)
*B23K 26/12* (2014.01)

(52) U.S. Cl.
CPC .......... *B23K 26/0639* (2013.01); *B23K 26/08* (2013.01); *B23K 26/127* (2013.01); *F27B 17/0025* (2013.01); *H01L 21/67248* (2013.01)

(56) References Cited

U.S. PATENT DOCUMENTS

| | | |
|---|---|---|
| 6,645,838 B1 | 11/2003 | Talwar et al. |
| 6,747,245 B2 | 6/2004 | Talwar et al. |
| 6,884,968 B2 | 4/2005 | Probst et al. |
| 7,083,676 B2 | 8/2006 | Chang et al. |
| 7,098,155 B2 | 8/2006 | Talwar et al. |
| 7,145,104 B2 | 12/2006 | Talwar et al. |
| 7,148,159 B2 | 12/2006 | Talwar et al. |
| 7,153,760 B2 | 12/2006 | Golzarian |
| 7,157,660 B2 | 1/2007 | Talwar et al. |
| 7,279,721 B2 | 10/2007 | Jennings et al. |
| 7,435,927 B2 | 10/2008 | Bruland et al. |
| 7,466,735 B2 | 12/2008 | Tanaka et al. |
| 9,114,479 B2 * | 8/2015 | Moffatt |
| 2002/0050488 A1 * | 5/2002 | Nikitin ............... B23K 26/0604 219/121.64 |
| 2004/0069751 A1 | 4/2004 | Yamazaki et al. |
| 2005/0103998 A1 | 5/2005 | Talwar et al. |
| 2008/0045040 A1 | 2/2008 | Nakao |
| 2008/0182430 A1 | 7/2008 | Chen et al. |
| 2008/0210667 A1 | 9/2008 | Yang et al. |

FOREIGN PATENT DOCUMENTS

| | | |
|---|---|---|
| JP | 2004-128421 A | 4/2004 |
| KR | 20050076768 A | 7/2005 |

OTHER PUBLICATIONS

Official Letter dated Apr. 12, 2013, from European Patent Office for corresponding European Patent Application No. 09814993.3.
Office Action for Korean Application No. 10-2011-7008790 dated Sep. 29, 2016.

* cited by examiner

MANAGING THERMAL BUDGET IN ANNEALING OF SUBSTRATES

CROSS-REFERENCE TO RELATED APPLICATIONS

This application is a continuation of U.S. patent application Ser. No. 14/229,238, filed Mar. 28, 2014, is a continuation of U.S. patent application Ser. No. 12/212,157, each of which is herein incorporated by reference.

BACKGROUND OF THE INVENTION

Field of the Invention

Embodiments of the invention relate to a method of manufacturing a semiconductor device. More particularly, embodiments of the invention are directed to a method of thermally processing a substrate.

Background

The integrated circuit (IC) market is continually demanding greater memory capacity, faster switching speeds, and smaller feature sizes. One of the major steps the industry has taken to address these demands is to change from batch processing silicon wafers in large furnaces to single wafer processing in a small chamber.

During such single wafer processing the wafer is typically heated to high temperatures so that various chemical and physical reactions can take place in multiple IC devices defined in the wafer. Of particular interest, favorable electrical performance of the IC devices requires implanted regions to be annealed. Annealing recreates a more crystalline structure from regions of the wafer that were previously made amorphous, and activates dopants by incorporating their atoms into the crystalline lattice of the substrate, or wafer. Thermal processes, such as annealing, require providing a relatively large amount of thermal energy to the wafer in a short amount of time, and thereafter rapidly cooling the wafer to terminate the thermal process. Examples of thermal processes currently in use include Rapid Thermal Processing (RTP) and impulse (spike) annealing. While such processes are widely used, current technology is not ideal for large substrates which tend to be exposed to elevated temperatures for a long time period. These problems become more severe with increasing switching speeds and/or decreasing feature sizes.

In general, these thermal processes heat the substrates under controlled conditions according to a predetermined thermal recipe. These thermal recipes fundamentally consist of a temperature that the semiconductor substrate must be heated to the rate of change of temperature, i.e., the temperature ramp-up and ramp-down rates and the time that the thermal processing system remains at a particular temperature. For example, some thermal recipes may require the entire substrate to be heated from room temperature to a temperature of 400° C. or more for processing times that exceed the thermal budget of the devices formed on the substrate.

Moreover, to meet certain objectives, such as minimal inter-diffusion of materials between different regions of a semiconductor substrate, the amount of time that each semiconductor substrate is subjected to high temperatures must be restricted. To accomplish this, the temperature ramp rates, both up and down, are preferably high. In other words, it is desirable to be able to adjust the temperature of the substrate from a low to a high temperature, or visa versa, in as short a time as possible.

The requirement for high temperature ramp rates led to the development of Rapid Thermal Processing (RTP), where typical temperature ramp-up rates range from 200 to 400° C./s, as compared to 5-15° C./minute for conventional furnaces. Typical ramp-down rates are in the range of 80-150° C./s. A drawback of RTP is that it heats the entire wafer even though the IC devices reside only in the top few microns of the silicon wafer. This limits how fast one can heat up and cool down the wafer. Moreover, once the entire wafer is at an elevated temperature, heat can only dissipate into the surrounding space or structures. As a result, today's state of the art RTP systems struggle to achieve a 400° C./s ramp-up rate and a 150° C./s ramp-down rate.

As device sizes on substrates grow smaller in the future, thermal budgets must reduce as well, because smaller devices may be degraded more easily by inter-diffusion of materials. Temperature ramp-up and ramp-down rates must be increased to compress anneal times, for example below one second.

To resolve some of the problems raised in conventional RTP type processes, various scanning laser anneal techniques have been used to anneal the surface(s) of the substrate. In general, these techniques deliver a constant energy flux to a small region on the surface of the substrate while the substrate is translated, or scanned, relative to the energy delivered to the small region. Other laser scanning processes hold the substrate still and move the laser across the substrate surface. Due to the stringent uniformity requirements and the complexity of minimizing the overlap of scanned regions across the substrate surface, these types of processes are not effective for thermal processing contact level devices formed on the surface of the substrate. Additionally, thermal stresses generated in the substrate by the high thermal gradients associated with extreme localized heating may result in damage to the substrate.

In view of the above, there is a need for novel apparatuses and methods for annealing a semiconductor substrate with high ramp-up and ramp-down rates. This will offer greater control over the fabrication of smaller devices leading to increased performance.

SUMMARY

Embodiments described herein provide an apparatus for thermally treating a substrate, comprising a movable substrate support; a first energy source for directing annealing energy in a rectangular shape toward a first portion of a surface of the substrate support; a second energy source for directing preheat energy in a tapered shape toward a second portion of the surface of the substrate support; and an optical assembly housing the first and second energy sources.

Other embodiments provide an apparatus for thermally treating a substrate, comprising a movable substrate support; a first energy source for directing annealing energy in a rectangular shape toward a first portion of a surface of the substrate support; a second energy source for directing preheat energy in a triangular shape toward a second portion of the surface of the substrate support; and an optical assembly housing the first and second energy sources.

Other embodiments provide an apparatus for thermally treating a substrate, comprising a movable substrate support; a first energy source for directing shaped annealing energy in a rectangular shape toward a first portion of a surface of the substrate support; a second energy source for directing shaped preheat energy in a tapered shape toward a second portion of the surface of the substrate support; and an optical assembly housing the first and second energy sources.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

As device dimensions on substrates grow smaller, and as substrates themselves grow larger, it becomes increasingly impractical to perform thermal treatment on entire substrates at one time. The power required to energize the entire surface grows prohibitive, as does the opportunity for non-uniform treatment. Thermal treatment tools such as RTP chambers are therefore sometimes configured to treat portions of a substrate surface by turns. An exemplary thermal processing apparatus, such as the DSA® chamber available from Applied Materials, Inc., of Santa Clara, Calif., may be used to irradiate a small portion of the substrate surface with laser light to anneal the surface. At the edge of the laser beam, the substrate surface may be heated at an extreme rate, and the temperature gradient between the irradiated portion and the untreated portion may cause damaging thermal stress within the substrate. For this reason, the substrate is generally disposed on a heated chuck that maintains the entire substrate at an elevated ambient temperature to reduce the stress of heating to the anneal temperature. Frequently, however, the requirement of maintaining the substrate at an elevated temperature reduces the benefit of the thermal treatment. Embodiments of the current invention generally contemplate improved ways of thermally treating the substrate.

In general the term "substrates" as used herein can refer to articles formed from any material that has some natural electrical conducting ability or a material that can be modified to provide the ability to conduct electricity. Typical substrate materials include, but are not limited to, semiconductors, such as silicon (Si) and germanium (Ge), as well as other compounds that exhibit semiconducting properties. Such semiconductor compounds generally include group III-V and group II-VI compounds. Representative group III-V semiconductor compounds include, but are not limited to, gallium arsenide (GaAs), gallium phosphide (GaP), and gallium nitride (GaN). Generally, the term "semiconductor substrates" includes bulk semiconductor substrates as well as substrates having deposited layers disposed thereon. To this end, the deposited layers in some semiconductor substrates processed by the methods of the present invention are formed by either homoepitaxial (e.g., silicon on silicon) or heteroepitaxial (e.g., GaAs on silicon) growth. For example, the methods of the present invention may be used with gallium arsenide and gallium nitride substrates formed by heteroepitaxial methods. Similarly, the invented methods can also be applied to form integrated devices, such as thin-film transistors (TFTs), on relatively thin crystalline silicon layers formed on insulating substrates (e.g., silicon-on-insulator [SOI] substrates).

Figure 1A:
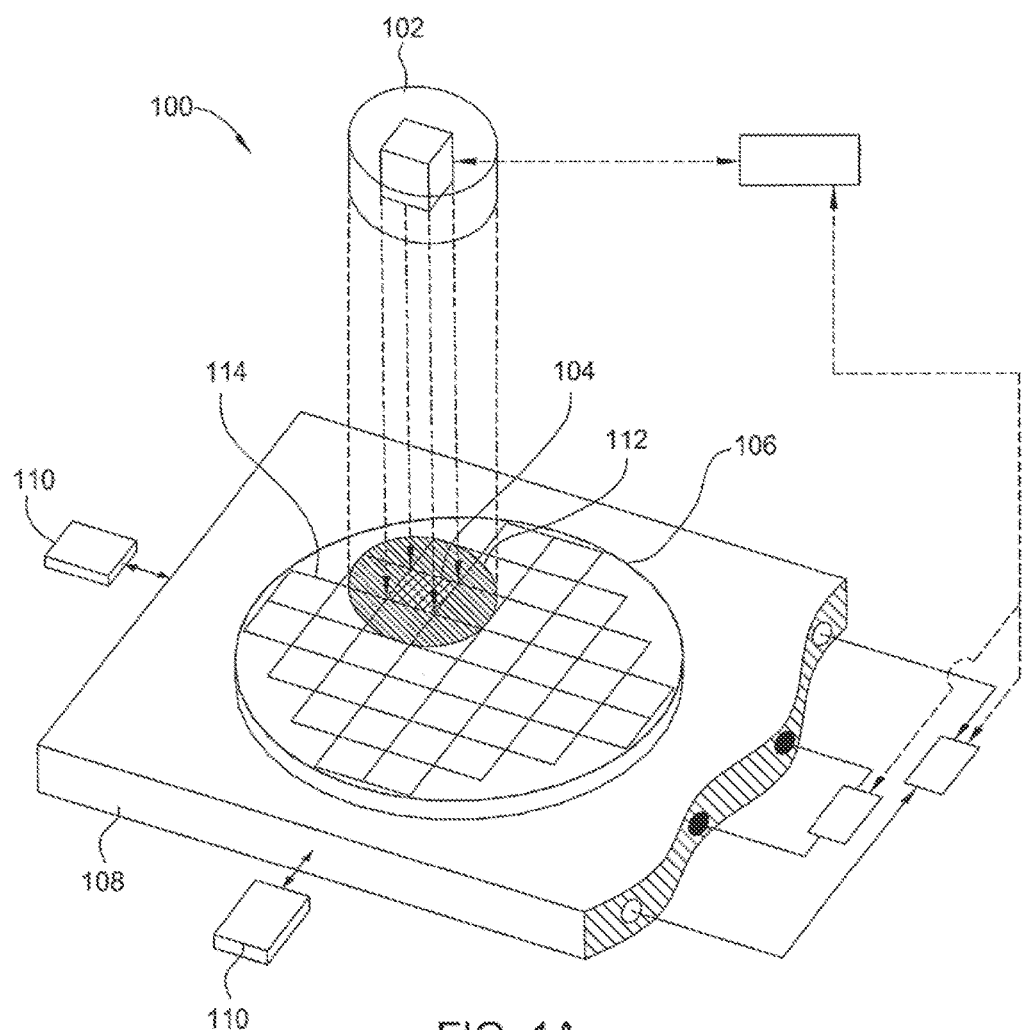
FIG. 1A is a schematic isometric view an apparatus according to one embodiment of the invention.

Some embodiments of the invention provide methods of thermally treating a substrate. FIG. 1A is a schematic isometric view an apparatus 100 according to one embodiment of the invention. FIG. 1A features an energy source 102 adapted to project an amount of energy on a defined region, or a anneal region 104, of a substrate 106 disposed on a work surface 108. The amount of energy projected onto the anneal region 104 is selected to cause annealing of the surface of the substrate 106. In some embodiments, the energy delivered by the energy source is less than that required to melt a portion of the substrate 106. In other embodiments, the energy delivered is selected to cause preferential melting of a portion of the substrate 106.

Figure 1B:
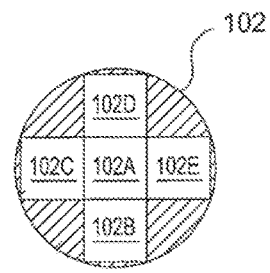
FIG. 1B is a schematic bottom view of one embodiment of the energy source of FIG. 1A.

In some embodiments, the energy source 102 comprises a plurality of emitters, as illustrated schematically in FIG. 1B, wherein emitters 102A-102E are shown embedded in energy source 102. The emitters 102A-102E generally emit radiation that is directed onto the substrate 106. In some embodiments, each of the emitters 102A-102E emits the same amount of energy. In other embodiments, the emitters 102A-102E may emit different amounts of energy. In one exemplary embodiment, the emitter 102A may emit an amount of energy selected to anneal the anneal region 104 of the substrate 106, while the emitters 102B-102E emit an amount of energy selected to preheat one or more portions of the substrate 106 near, adjacent to, or overlapping with the anneal region 104.

In one example, as shown in FIG. 1A, only one defined region of the substrate, such as anneal region 104, is exposed to the radiation from the energy source 102 at any given time. In one aspect of the invention, multiple areas of the substrate 106 are sequentially exposed to a desired amount of energy delivered from the energy source 102 to cause preferential melting of desired regions of the substrate. In another aspect, multiple areas of the substrate 106 are sequentially exposed to an amount of energy from the energy source 102 selected to anneal desired regions of the substrate without melting.

In general, the areas on the surface of the substrate may be sequentially exposed by translating the substrate relative to the output of the electromagnetic radiation source (e.g., conventional X/Y stage, precision stages) and/or translating the output of the radiation source relative to the substrate. Typically, one or more conventional electrical actuators 110 (e.g., linear DC servo motor, lead screw and servo motor), which may be part of a separate precision stage (not shown), are used to control the movement and position of substrate 106. Conventional precision stages that may be used to support and position the substrate 106 are available from Parker Hannifin Corporation, of Rohnert Park, Calif.

In other embodiments, the source of electromagnetic radiation may be translated relative to the substrate. In the embodiment of FIG. 1A, for example, the energy source 102 may be coupled to a positioning apparatus (not shown), such as a Cartesian frame, adapted to position the energy source 102 over the desired region of the substrate 106. The positioning apparatus may additionally be configured to adjust elevation of the energy source above the substrate 106.

Referring again to FIG. 1A, a preheat region 112 is defined on the surface of the substrate 106. In some embodiments, the preheat region 112 surrounds the anneal region 104. In other embodiments, the preheat region may be adjacent to the anneal region 104, or may overlap with the anneal region 104. In still other embodiments, the preheat region 112 may be near the anneal region 104, with a gap or space between the preheat region 112 and the anneal region 104. In some embodiments, the preheat region may be spaced apart from the anneal region. The preheat region may thus have any convenient shape, such as the circular preheat region 112 shown in the embodiment of FIG. 1A.

Figure 2:
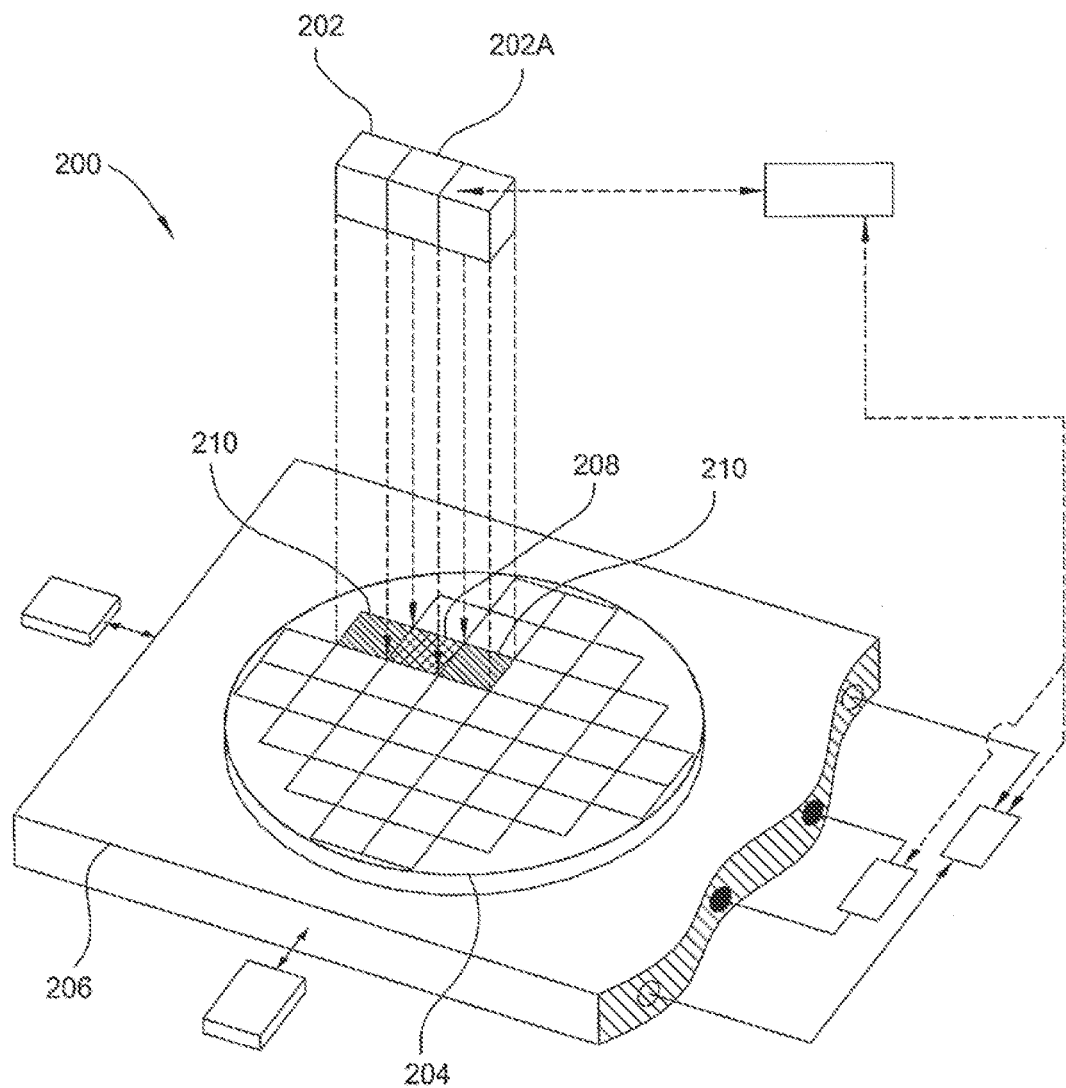
FIG. 2 is a schematic isometric view of an apparatus according to another embodiment of the invention.

FIG. 2 is a schematic isometric view of an apparatus 200 according to another embodiment of the invention. An energy source 202 is configured to direct energy toward a substrate 204 disposed on a work surface 206. In some embodiments, the energy source 202 comprises a plurality of emitters 202A that emit electromagnetic energy of a nature selected to thermally treat a surface of the substrate 204. At least one of the emitters 202A may be adapted to anneal an anneal portion 208 of the substrate 204, while at least one of the emitters 202A is adapted to preheat a preheat portion 210 of the substrate 204. In the embodiment of FIG. 2, the preheat portion 210 is shown adjacent to the anneal portion 208. Other embodiments may feature a preheat portion 210 that overlaps the anneal portion 208, or is spaced apart from the anneal portion 208.

Figure 3A:
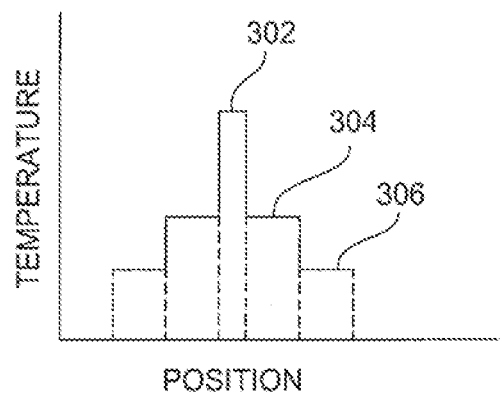
FIG. 3A is a graph of temperature versus position on a substrate undergoing a process according to one embodiment of the invention.

FIG. 3A is a generalized graph showing the effect on a substrate of implementing an embodiment of the invention. As shown in FIG. 3A, portions of the substrate are maintained at different temperatures in different zones. The graph of FIG. 3A schematically represents the temperature of points on the surface of a substrate undergoing an anneal process, the points arranged on a line drawn through the treatment zone. A first zone 302 may be maintained at a high temperature selected to anneal the substrate surface. This zone may correspond to the anneal region 104 of FIG. 1A, the anneal region 204 of FIG. 2, or any region of a substrate to be heated to a high temperature.

The embodiment of FIG. 3A features a second zone 304 generally maintained at a different temperature, which is lower in the example of FIG. 3A. The second zone 304 may surround the first zone 302 in some embodiments. In other embodiments, the second zone 304 may be adjacent to the first zone 302, may overlap the first zone 302, or may be spaced apart from the first zone 302. The temperature of the second zone 304 is generally lower than that of the first zone 302. The temperature of the second zone 304 may be selected to preheat portions of the substrate, reducing the thermal stress on the substrate due to very abrupt temperature changes.

A third zone 306 is generally also defined on the substrate. In most embodiments, the third zone 306 will be a zone in which ambient temperature predominates. The third zone 306 may thus be an ambient zone in many embodiments. In some embodiments, however, the third zone 306 may also receive applied thermal energy, either by ambient heating with, for example, a heated support, or by further use of electromagnetic energy. The temperature of the third zone 306 will generally be less than that of the second zone 304, following the idea of progressive preheating closer to the first zone 302. The third zone 306 may surround the second zone 304 in some embodiments, or may be adjacent to the second zone in other embodiments. In some embodiments, the temperature of the third zone will be maintained below about 500° C.

The second zone 304 may have a temperature between that of the first zone 302 and the third zone 306. To accomplish the desired preheating, the temperature of the second zone 304 may effect a temperature rise of between about 30% and about 70% of the full temperature rise from the temperature of the third zone 306 to that of the first zone 302. In some embodiments, the temperature rise of the second zone 304 relative to the third zone 306 is about 50% of the temperature rise of the first zone 302 relative to the third zone 306.

In some embodiments, the temperature of the first zone 302 may be between about 1,100° C. and about 1,400° C., such as between about 1,250° C. and about 1,350° C. In some embodiments, the temperature difference between the first zone 302 and an ambient temperature will be between about 90% and about 99%, such as about 95%, of the temperature difference between the melting point of the substrate and the ambient temperature. In some embodiments, the temperature of the second zone 304 may be between about 300° C. and about 800° C. The temperature of the second zone 304 is generally selected to diminish thermal stress at the boundary between the first zone 302 and the second zone 304, but is also generally below the level at which portions of the substrate are amorphized. The temperature of the second zone 304 will generally be selected to preheat portions of the substrate to be annealed while cooling portions that have been annealed. The temperature of the second zone 304 is generally below that required to dislodge atoms from the crystal lattice. In one exemplary embodiment featuring a silicon-containing substrate, the temperature of the first zone 302 may be about 1,350° C., that of the second zone 304 about 650° C., and that of the third zone 306 about 20° C., or another ambient temperature.

Figure 3B:
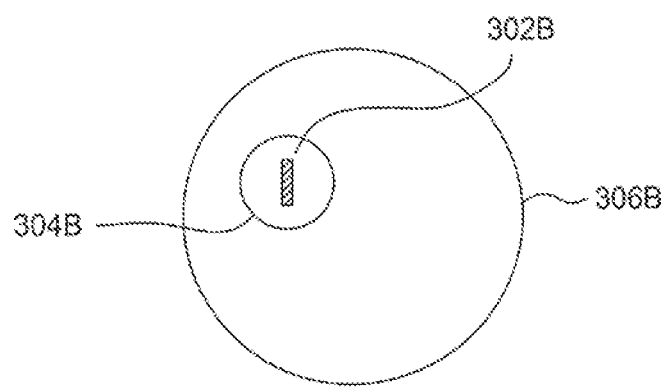
FIGS. 3B-3C are schematic top views of substrates undergoing processes according to two embodiments of the invention.
Figure 3C:
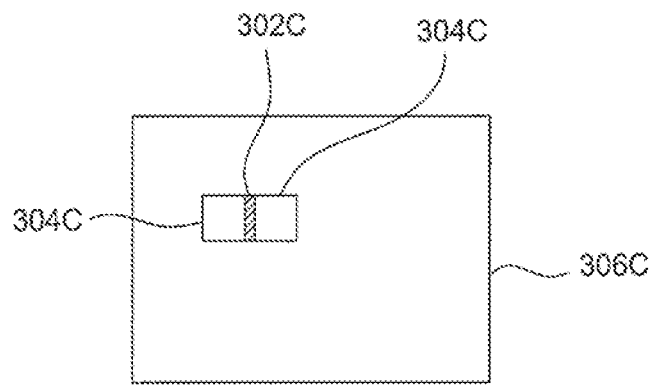

FIGS. 3B and 3C are schematic diagrams of substrates, each having a plurality of treatment zones defined thereon. The treatment zones represent areas of the substrate being heated by electromagnetic radiation. The embodiment of FIG. 3B has a first zone 302B surrounded by a second zone 304B and a third zone 306B. It should be noted that the zones may have similar or different shapes. The embodiment of FIG. 3B features a rectangular first zone 302B, with circular second and third zones 304B and 306B. Alternate embodiments may have circular shapes for all three zones. The embodiment of FIG. 3C features a rectangular first zone 302C, with a rectangular or square second zone 304C adjacent to the first zone 302C on either side, all surrounded by a third zone 306C, which is an ambient zone. It should also be noted that the second zone may be maintained at a single temperature throughout, or portions of the second zone may be maintained at different temperatures. For example, the second zone 304B of the embodiment of FIG. 3B may be a single temperature throughout, whereas the second zone 304C of the embodiment of FIG. 3C may have portions at different temperatures. If one portion of the second zone 304C is intended as a preheat zone and another as a cool-down zone, the preheat portion may be maintained at a higher temperature than the cool-down portion. It should be noted that a substrate of any reasonable shape, such as circular, rectangular, or any other planar shape, will benefit from embodiments of the invention described herein.

In some embodiments, there may be multiple zones of elevated temperature between the ambient zone and the anneal zone. Some embodiments may feature a plurality of preheat zones with a single anneal zone. Some embodiments may feature a first plurality of preheat zones and a second plurality of cool-down zones. In some embodiments, one zone may surround the zone of next higher temperature, such that each zone surrounds, and is surrounded by, another zone. Such embodiments may have zones that approximate concentric circles in shape, or nested circles with centers at different points (i.e. non-concentric circles). Zones of many different shapes may be useful in some embodiments, such as various different polygonal shapes, for example triangular, rectangular, square, trapezoidal, hexagonal, and the like. Naturally, different shapes may be used for different zones. In other embodiments, a zone may be adjacent to the zone of next higher temperature on one side and next lower temperature on the other side. In still other embodiments, some zones may be adjacent to other zones, and some zones may surround other zones. For example, a first zone may be defined as an anneal zone, with an adjacent second zone for preheat on a first side of the first zone and cool-down on a second side of the first zone, with both the first and second zones surrounded by a third zone, which is maintained at a temperature above ambient temperature, and a fourth zone surrounding all the other zones maintained at ambient temperature.

In one exemplary embodiment, a rectangular anneal zone may be surrounded by one or more preheat zones shaped like a rectangle with triangles on opposite sides. Such a tapered shape may facilitate heating and cooling of the substrate surface in a desirable way. In another exemplary embodiment, an anneal zone that may be rectangular or circular may be surrounded by one or more preheat zones having a teardrop shape. The rounded portion of the teardrop shape may be a preheat zone, while the "tail" of the teardrop may be a cool-down zone.

In some embodiments, one or more of the preheat or cool-down zones may be spaced apart from the anneal zone, with a gap between the anneal zone and the preheat and/or cool-down zones. For example, four zones may be defined on a substrate surface to be annealed, an ambient zone, a preheat zone, an anneal zone, and a cool-down zone. The anneal zone may be a rectangle having two long sides measuring 11 mm and two short sides measuring 100 µm. The preheat zone may be an isosceles triangle with a base measuring 13 mm and height of 5 mm, with the base parallel to a long side of the anneal zone, spaced about 1 mm from the long side of the anneal zone, and centered with respect to the anneal zone such that a line that bisects the isosceles triangle also bisects the anneal zone into two rectangles 5.5 mm long and 100 µm wide. The cool-down zone may likewise be an isosceles triangle similar to the preheat zone. If the anneal zone temperature is 1,200° C., the temperature of the preheat zone may be between about 600° C. and about 700° C., such that the temperature of the substrate surface falls slightly as it passes through the gap between the preheat zone and the anneal zone. The temperature of the substrate surface may, for example, fall to about 500° C. prior to passing into the anneal zone. Such a preheat profile may be useful for minimizing perturbation of atoms deep in the bulk of the substrate while preheating the surface. Extending the length of the base of the isosceles triangle that forms the preheat zone may provide heating for areas of the substrate surface adjacent to the short side of the anneal zone to prevent damaging thermal stresses on the substrate. A similar cool-down zone located adjacent the opposite long side of the anneal zone from the preheat zone may be useful for accelerating cooling while avoiding damaging thermal stresses.

Some embodiments may feature a plurality of anneal zones and a plurality of zones having different intermediate temperatures. Each anneal zone may be maintained at the same temperature, or at different temperatures depending on the needs of individual embodiments. In embodiments of this sort, preheat zones may be defined between, among, around, adjacent to, surrounding, or spaced apart from anneal zones. For example, in one embodiment, a substrate may be processed in four portions by an apparatus that defines a plurality of treatment zones in each portion. Thus, each portion may have an anneal zone surrounded by a preheat zone, and further by an ambient zone, the zones translating across each portion simultaneously to process the substrate. In such an embodiment, the zones may be shaped and configured in any of the ways described elsewhere herein, and the position of the heated zones within each portion may be maintained at a pre-selected distance from the heated zones within the other portions to manage the overall thermal budget of the substrate.

In some embodiments, the preheat zones, or the preheat and cool-down zones, may be shaped in a convenient way. Embodiments have been described in which the preheat and cool-down zones are rectangular, and are disposed on two sides of an anneal zone, as depicted in the embodiment of FIG. 3C. In other embodiments, the shape of the preheat and cool-down zones may be tapered away from the anneal zone. In embodiments wherein the preheat and cool-down zones do not surround the anneal zone, the preheat and cool-down zones will generally be coextensive with at least one dimension of the anneal zone. In some embodiments, the preheat and cool-down zones may grow narrower with distance from the anneal zone. In some embodiments, the preheat and cool-down zones may have triangular, trapezoidal, parabolic, elliptical, oval, or irregular shapes. In other embodiments, the preheat and cool-down zones may have the shape of a rectangle coupled to a semi-circle. The shapes may be mixed, with a preheat zone having one shape and a cool-down zone having another shape. In embodiments wherein the preheat and cool-down zones surround the anneal zone to form a single intermediate-temperature zone, the single intermediate-temperature zone may be shaped as well. An intermediate-temperature zone surrounding an anneal zone may have an elliptical, oval, or diamond shape in some embodiments. In other embodiments, a rectangular zone may surround the anneal zone. In still other embodiments, the intermediate-temperature zone may have irregular or complex-regular shape, such as a pair of abutting trapezoids.

In one embodiment, the intermediate-temperature zone may have a generally oval shape and may be irregularly placed with respect to the anneal zone. In such an embodiment, a centroid of the anneal zone will be displaced away from a centroid of the intermediate-temperature zone. Thus, a plurality of line segments drawn from starting points on the edge of the intermediate-temperature zone, each segment perpendicular thereto at its respective starting point, to ending points on the edge of the anneal zone will have lengths ranging from a maximum to a minimum value. It may be advantageous to maintain more distance between the edge of the anneal zone and the edge of the intermediate-temperature zone in the direction of the anneal path, so that as the anneal energy moves across the surface of the substrate, enough preheat energy is applied to prevent damage to the substrate, and enough energy is applied to the cool-down zone to facilitate rapid cooling without damage after annealing is finished. In such an embodiment, a plot of temperature versus time for a particular point on the substrate surface may have the shape of half a teardrop.

Figure 4:
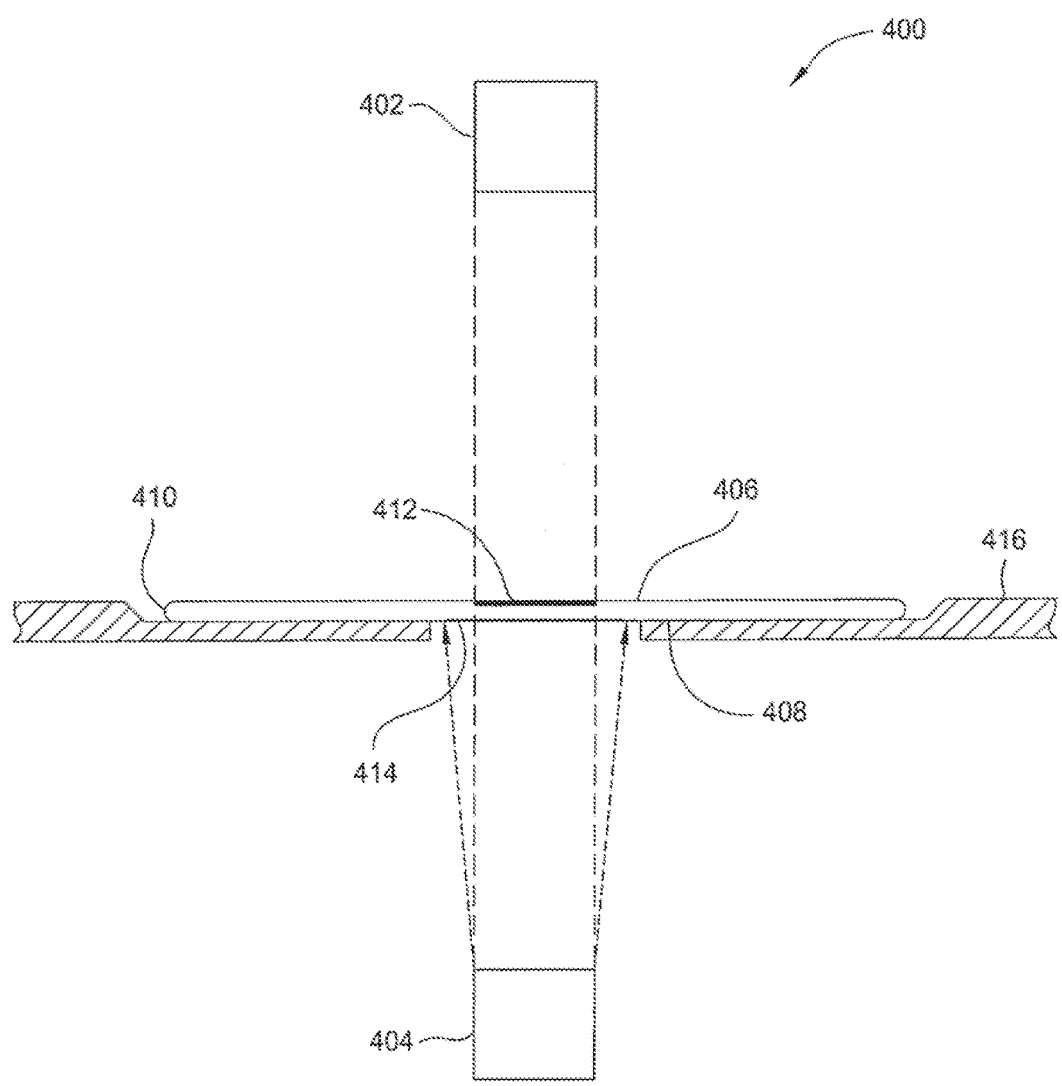
FIG. 4 is a schematic side view of an apparatus according to one embodiment of the invention.

FIG. 4 is a schematic side view of an apparatus 400 according to another embodiment of the invention. A first energy source 402 and a second energy source 404 are disposed to direct energy toward a first surface 406, and a second surface 408, respectively, of a substrate 410. The first energy source 402 directs energy toward a first zone 412 of the substrate 410. The second energy source 404 directs energy toward a second zone 414 of the substrate 410. In most embodiments, the first zone 412 is smaller than the second zone 414, and the boundaries of the second zone 414 extend beyond the boundaries of the first zone 412 on all sides. In most embodiments, the first energy source 402 directs electromagnetic energy toward the substrate 410, irradiating the first zone 412 with energy selected to heat the first zone 412 to an anneal temperature, while the second energy source 404 irradiates the second zone 414 with energy selected to heat the second zone 414 to an intermediate temperature. The heating of the second zone 414 to an intermediate temperature serves to preheat portions of the substrate to be annealed to avoid severe thermal stresses due to abrupt temperature changes at the edges of the first zone 412. In general, an energy source designed to anneal a substrate will deliver power density of at least 1 W/cm$^2$ to the substrate surface, and an energy source designed to merely heat the substrate will deliver power density of at least 0.1 W/cm$^2$, but less than that required to anneal.

In one aspect, the anneal region is sized to match the size of an individual die (e.g., 40 "dice" are shown in FIG. 1A), or semiconductor device (e.g., memory chip), formed on the surface of the substrate. Referring again to FIG. 1A, in one aspect, the boundary of the anneal region 104 is aligned and sized to fit within "kerf" or "scribe" lines 114 that define the boundary of each die. In one embodiment, prior to performing the annealing process the substrate is aligned to the output of the energy source 102 using alignment marks typically found on the surface of the substrate and other conventional techniques so that the anneal region 104 can be adequately aligned to the die. Sequentially placing anneal regions 104 so that they only overlap in the naturally occurring unused space/boundaries between dice, such as the scribe or kerf lines 114, reduces the need to overlap the energy in the areas where the devices are formed on the substrate and thus reduces the variation in the process results between the overlapping anneal regions. This technique has advantages over conventional processes that sweep the laser energy across the surface of the substrate, since the need to tightly control the overlap between adjacently scanned regions to assure uniform annealing across the desired regions of the substrate is not an issue due to the confinement of the overlap to the unused space between dice. Confining the overlap to the unused space/boundary between dice also improves process uniformity results versus conventional scanning anneal type methods that utilize adjacent overlapping regions that traverse all areas of the substrate. Therefore, the amount of process variation, due to the varying amounts of exposure to the energy delivered from the energy source 102 to process critical regions of the substrate is minimized, since any overlap of delivered energy between the sequentially placed anneal regions 104 can be minimized.

Referring to FIG. 1A, in one example, each of the sequentially placed anneal regions 104 is a rectangular region that is about 22 mm by about 33 mm in size (e.g., area of 726 square millimeters (mm$^2$)). In one aspect, the area of each of the sequentially placed anneal regions 104 formed on the surface of the substrate is between about 4 mm$^2$ (e.g., 2 mm×2 mm) and about 1000 mm$^2$ (e.g., 25 mm×40 mm). A circular preheat region 112 may surround the anneal region 104, and may extend up to about 100 mm beyond an edge of the anneal region 104. In an embodiment such as that shown in FIG. 1A, the preheat region 112 will preferably extend no less than about 50 mm beyond an edge of the anneal region 104. The extent of the preheat region or intermediate-temperature region beyond the anneal region will generally depend on the size of the substrate and the available energy delivery resources. It will be desireable, in most embodiments, to size the various intermediate temperature regions such that power requirements are minimized while providing the thermal budget management needed for the embodiment. In some embodiments the intermediate-temperature region extends beyond the anneal region less than 100 mm in at least one direction, such as less than 50 mm, for example about 30 mm.

Referring now to FIG. 2, in another example, each anneal portion 208 may have dimensions similar to those of the anneal regions 104 of FIG. 1A. The preheat regions 210 are shown adjacent to the anneal portion 208 on either side, and co-extensive with one dimension of the anneal portion 208. The preheat regions 210 may extend between about 50 mm and about 100 mm beyond the edge of the anneal portion 208 in some embodiments.

The size of the preheat zone or region will generally be selected to allow adequate preheating in the preheat zone. In some embodiments, each preheat zone may be larger than the anneal zone in order to allow for adequate preheating. In an embodiment featuring sequential exposure of successive anneal regions, the time required to preheat a preheat zone to a desired temperature may be longer than the time required to anneal the anneal zone. Thus, an individual location on the substrate may be subjected to two or more preheat processes.

In most embodiments, the energy source is generally adapted to deliver electromagnetic energy to anneal certain desired regions of the substrate surface. Typical sources of electromagnetic energy include, but are not limited to optical radiation sources (e.g., lasers), electron beam sources, ion beam sources, microwave energy sources, visible light sources, and infra-red sources. In one aspect, the substrate may be exposed to a pulse of energy from a laser that emits radiation at one or more appropriate wavelengths for a desired period of time. In another aspect, flash lamps may be used to generate visible light energy for pulsing onto the substrate. In one aspect, a pulse of energy from the energy source is tailored so that the amount of energy delivered to the anneal region and/or the amount of energy delivered over the period of the pulse is optimized to perform targeted annealing of desired areas. In one aspect, the wavelength of a laser is tuned so that a significant portion of the radiation is absorbed by a silicon layer disposed on the substrate. For laser anneal processes performed on a silicon containing substrate, the wavelength of the radiation is typically less than about 800 nm, and can be delivered at deep ultraviolet (UV), infrared (IR) or other desirable wavelengths. In one embodiment, the energy source may be an intense light source, such as a laser, that is adapted to deliver radiation at a wavelength between about 500 nm and about 11 micrometers. In most embodiments, the anneal process generally takes place on a given region of the substrate for a relatively short time, such as on the order of about one second or less.

In some embodiments, the energy source comprises a plurality of emitters, at least one of which emits annealing energy as described above, and at least one of which emits preheating energy. The preheating energy may be continuous wave energy or it may be delivered in pulses. The preheating energy may be coherent or incoherent, monochromatic or polychrome, polarized or non-polarized, or any combination or degree thereof. The preheating energy may be delivered as intense white light, as infra-red light, or as laser light. Intense white light may be delivered using xenon lamps. Infra-red light may be delivered using heat lamps. In some embodiments, the preheating energy may be delivered as continuous wave radiation, with the anneal energy delivered in pulses. The preheat energy is generally selected to raise the temperature of a substrate a fraction of the amount required for annealing or melting. In one embodiment, a laser may be disposed above a work surface, with four heat lamps surrounding the laser to preheat an area around the anneal zone. In another embodiment, four xenon lamps may be used to deliver intense white light instead of the heat lamps.

Figure 5:
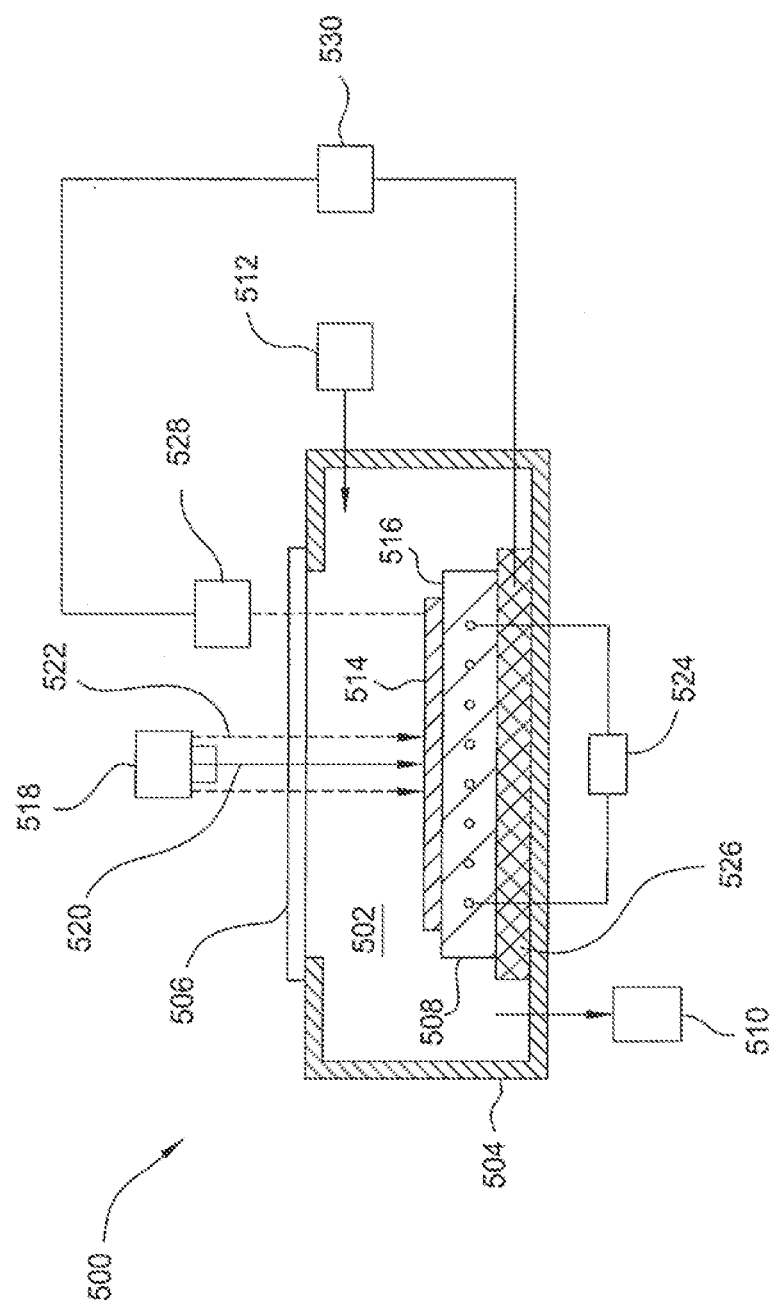
FIG. 5 is a schematic cross-sectional diagram illustrating a processing chamber according to an embodiment of the invention.

FIG. 5 is a schematic cross-sectional diagram illustrating a processing chamber 500 useful for practicing embodiments of the invention. The processing chamber 500 comprises an optically transparent window 506 formed on a chamber body 504. The chamber body 504 defines a processing volume 502. In one embodiment, the processing volume 502 may have an inert environment maintained by an inert gas source 512 and a vacuum pump 510 connected to the processing volume 502.

A substrate support 508 is deposed in the processing volume 502. The substrate support 508 is configured to support and move a substrate 514 disposed on a top surface 516. An energy source 518 is positioned outside the chamber body 504 and is configured to project energy through the optically transparent window 506. The energy source may be configured to project annealing energy 520 and preheat energy 522 in any of the ways described elsewhere herein. The substrate support 508 may be connected to a temperature control unit 524 having cooling and heating capacities for the substrate 514 disposed on the substrate support 508. The substrate support 508 may be connected to one or more high precision stages 526 which allow precise alignment and relative movement between the substrate 514 and the energy source 518 during processing.

In one embodiment, an optical sensor 528 may be used to assist alignment of the substrate 514 with the energy source 518. The optical sensor 528 may be positioned near the optically transparent window 506 and connected to a control unit 530 which is further connected to the high precision stage 526. During alignment, the optical sensor 528 may "look" through the optically transparent window 506 to locate visual markers on the substrate 514, for example a notch, and a scribe line around a die. The control unit 530 processes signals from the optical sensor 528 and generates control signals to the high precision stage 526 for alignment adjustment.

Figure 6:
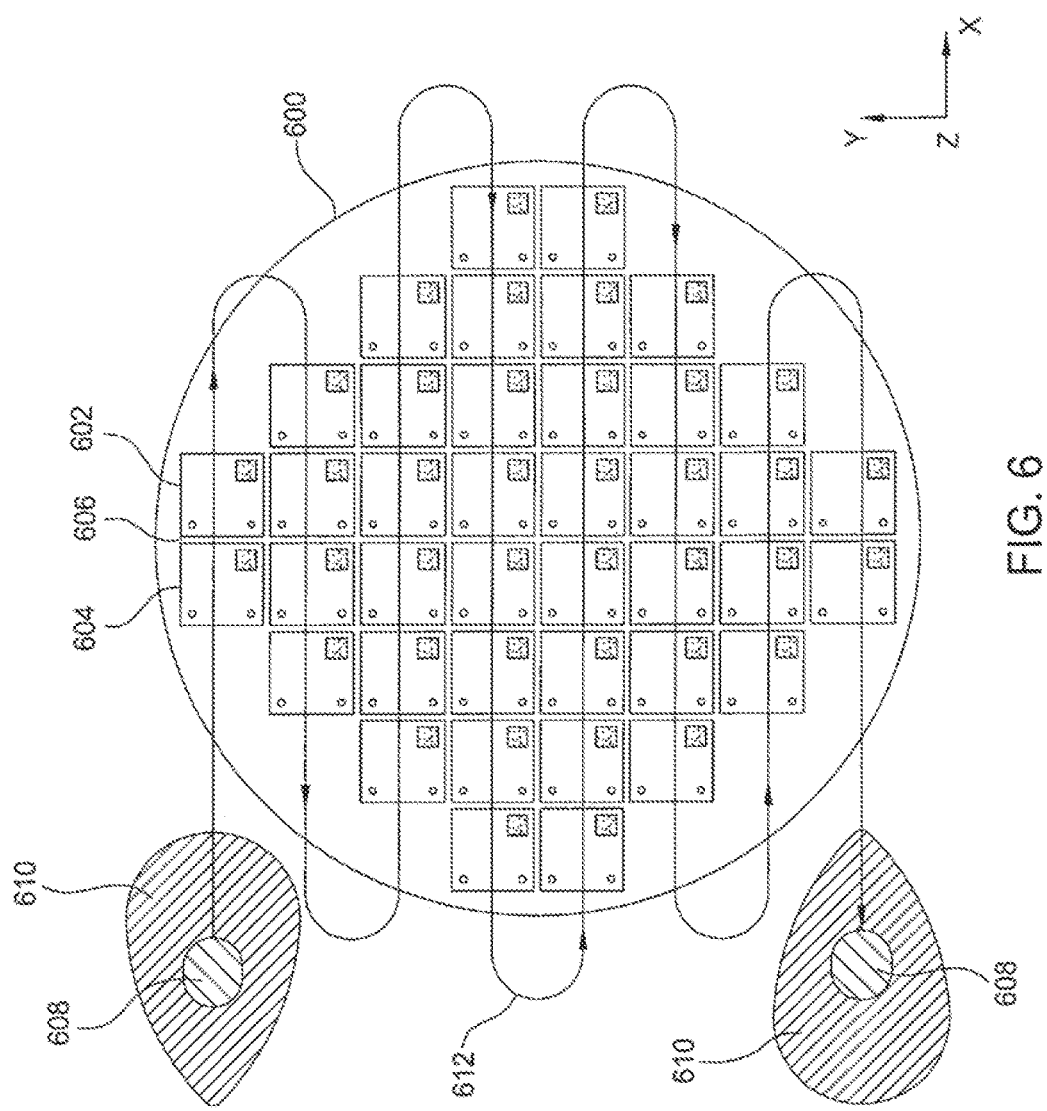
FIG. 6 is a schematic top view of a substrate undergoing a process according to one embodiment of the invention.

As described above, due to power requirements, a substrate is generally annealed one portion at a time. After each individual anneal, the electromagnetic energy must be translated with respect to the substrate to illuminate the next anneal portion. FIG. 6 is a schematic top view of a substrate 600 that contains forty rectangular dice 602 arranged in an array. Each die 602 is delimited by scribe lines 604, which also define an unused area 606 between the dice. A first energy projection region 608 is provided to project a first quantity of energy toward a single die 602. In general, the first energy projection region 608 may cover an area equal to or greater than the area of each die 602, but smaller than the area of each die 602 plus the unused area 606 surrounding the scribe lines 604, so that the energy delivered in the energy projection region 608 completely covers the die 602 while not overlapping with the neighboring dice 602. A second energy projection region 610 is provided surrounding the first energy projection region 608 to deliver a second quantity of energy to the substrate 600. The first quantity of energy will generally differ from the second quantity of energy. In some embodiments, the first quantity of energy will have higher intensity and more power than the second quantity of energy. In some embodiments, the first quantity of energy may be selected to anneal the portion of the substrate surface inside the first energy projection region 608. In other embodiments, the first quantity of energy may be selected to preferentially melt portions of the substrate surface inside the first energy projection region 608. The second quantity of energy may be selected to preheat portions of the substrate surface in the second energy projection area 610. The preheat temperature rise of the second energy projection region 610 may be a fraction of that reached in the first energy projection region 608, such as between about 30% to about 70%, or preferably about 50%. The second energy projection region 610 thus maintains the temperature of the substrate surface therein below that reached in the first energy projection region 608, so that the temperature gradient at the interface between the first and the second energy projection regions generates thermal stress in the substrate less than that required to damage the substrate.

To perform an annealing process on multiple dice 602 spread out across the substrate surface, the substrate and/or the output of an energy source is positioned and aligned relative to each die 602. In one embodiment, curve 612 illustrates a relative movement between the dice 602 of the substrate 600 and the energy projection regions 608 and 610 during an anneal sequence performed on each die 602 on the surface of the substrate 600. In one embodiment, the relative movement may be achieved by translating the substrate in x and y direction so that they follow the curve 612. In another embodiment, the relative movement may be achieved by moving the energy projection regions 608 and 610 relative to a stationary substrate 600. The energy projection regions 608 and 610 may be moved by moving the energy source relative to the substrate 600, or by manipulating the energy itself. In an embodiment that uses electromagnetic energy, the energy may be manipulated using optics without moving either the substrate or the energy source. For example, one or more mirrors or lenses may direct the projected energy toward successive dice 602, moving the energy projection regions 608 and 610 accordingly.

Additionally, a path different than that represented by the curve 612 may be used to optimize throughput and process quality depending on a particular arrangement of dice 602. For example, an alternate anneal path may follow a substantially spiral pattern, starting with dice 602 near the center of substrate 600 and proceeding in an expanding circular pattern, or starting with dice 602 at one edge of the substrate and proceeding in a contracting circular pattern. In one embodiment, it may be advantageous to pursue an anneal path along diagonals, proceeding along a path drawn through diagonals of dice 602. Such a path may minimize the opportunity for overlap of anneal regions on successive dice 602.

As the energy source proceeds along an anneal path, the energy projection regions move along the surface of the substrate. The second energy projection region 610 of FIG. 6 precedes the first energy projection region 608 in all directions. The second energy projection region 610 may therefore be used to preheat portions of the substrate to be annealed in the first energy projection region 608. Preheating reduces the impact of thermal stresses on the substrate, preventing damage to the substrate at the edge of the anneal region.

In an alternate embodiment, the second energy projection region may be adjacent to the first energy projection region. For example, the second energy projection region may be on both sides of the first energy projection region extending outward in the direction of the anneal path. Thus, one part of the second energy projection region, the part that travels in front of the first energy projection region as the projected energy travels along the anneal path, may preheat portions of the substrate to be annealed, while the other portion moderates cooling of the substrate behind the anneal region. An apparatus adapted to perform an anneal process of this sort may advantageously have the capability to rotate the energy sources when an extremity of the substrate is reached, so that the energy sources can travel in a different direction with the second energy projection region continuing ahead of the first energy projection region.

In one embodiment, during an annealing process, the substrate 600 moves relative to the energy projection regions 608 and 610, as shown by curve 612 of FIG. 6. When a particular die 602 is positioned and aligned within the first energy projection region 608, the energy source projects a pulse of energy towards the substrate 600 so that the die 602 is exposed to a certain amount of energy over a defined duration according to the particular anneal process recipe. The duration of the pulsed energy is typically short enough so that the relative movement between the substrate 600 and the first energy projection region 608 does not cause any "blur", i.e. non uniform energy distribution, across each die 602 and it will not cause damage to the substrate. Thus, the energy projection regions 608 and 610 may move continuously with respect to the substrate 600, while short bursts of annealing energy impact the various dice 602 in the first energy projection region. Energy impacting the second energy projection region 610 may likewise be pulsed or continuous. If pulsed, the energy projected toward the second energy projection region will generally be of a nature selected to raise the temperature of the substrate surface in the second energy projection region a substantial fraction, such as about 30% to about 70%, or more preferably about 50%, of the temperature rise imparted to the first energy projection region over the exposure time of the first energy projection region to manage the thermal budget of the substrate.

For example, if the first energy projection region experiences a first pulse of incident energy that increases the temperature of the substrate from 20° C. to 1,300° C., such as a 10 nanosecond laser burst, the second pulse of incident energy delivered to the second energy projection region should raise the temperature of the substrate in that region to at least about 600° C. during the first burst. If necessary, the second pulse may be longer than the first pulse to allow the second energy projection region time to heat up. It may be advantageous, in some embodiments, for the second energy projection region to encompass the first energy projection region, starting before the first pulse and ending after the first pulse, such that a second pulse delivered over an interval that encompasses the first pulse preheats the area to be subjected to the first pulse, along with adjacent areas of the substrate.

In other embodiments, the energy delivered to the second energy projection region may be continuous, while that delivered to the first energy projection region is pulsed. In some embodiments, multiple pulses of energy may be delivered to the first energy projection region, while continuous energy is delivered to the second energy projection region.

Figure 7:
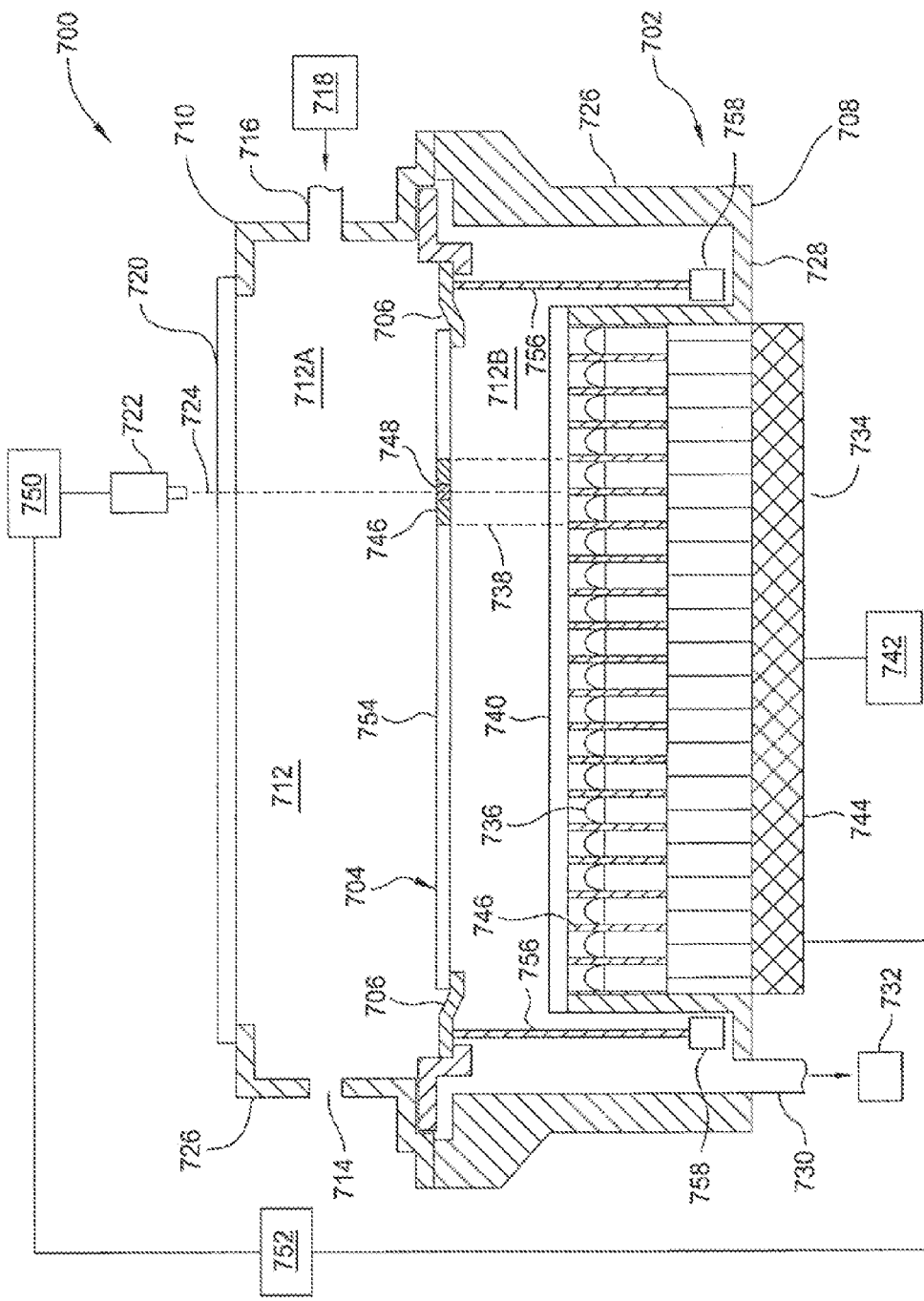
FIG. 7 is a schematic cross-sectional diagram illustrating a processing chamber according to an embodiment of the invention.

FIG. 7 is a schematic cross-sectional view of an apparatus 700 according to another embodiment of the invention. The apparatus 700 comprises a chamber 702 for processing a substrate 704. The substrate is positioned on a substrate support 706 inside the chamber 702. In the embodiment of FIG. 7, the substrate support 706 is represented as a ring, because the embodiment of FIG. 7 irradiates the substrate 704 from the front side and the back side. In alternate embodiments, the substrate 704 may be irradiated from one side only, and may rest on a substrate support such as the exemplary substrate support 508 of FIG. 5. Lift pins 756, with actuators 758, raise and lower the substrate support 706 for insertion and removal of substrates from the chamber 702. The chamber 702 has a lower portion 708 and an upper portion 710, that together define a processing volume 712. The upper portion generally has an upper wall 726 that defines an upper processing volume 712A above the substrate 704. The upper portion 710 may have an opening 714 for depositing and retrieving substrates, and a gas inlet 716 to provide process gases from a process gas source 718. The upper portion 710 supports a first window 720 made of a material selected for its light transmission and absorption properties. A first energy source 722 is positioned outside the chamber 702 to direct a first energy 724 toward the first window 720. The first window preferably admits some or all of the first energy 724 into the chamber 702.

The lower portion 708 of the chamber 702 comprises a lower chamber wall 728 that defines a lower processing volume 712B. The lower portion 708 may have a gas outlet 730 coupled to a pump 732 for removing process gases from the chamber 702. The lower portion 708 of the chamber 702 houses a second energy source 734. The second energy source 734 comprises a plurality of light sources 736 for generating a second energy 738 and directing the second energy 738 toward the substrate 704. A second window 740 covers the plurality of light sources 736. Each light source is housed in a tube 746, which may be reflective to direct energy from the light source 736 toward the substrate 704. The light sources 736 are generally powered by a power supply 742. In the embodiment of FIG. 7, power from the power supply 742 is routed through a switching box 744 that routes power from the power supply 742 to one or more of the light sources 736. By controlling the operation of the switching box 744, the light sources 736 can be selectively energized.

In many embodiments, the light sources 736 will be infra-red light generators, such as heat lamps, but they may also be configured to generate broad-spectrum light, ultra-violet light, or combinations of wavelengths across the broad spectrum from ultra-violet to infra-red. In some embodiments, the light sources 736 may be white light lamps, such as halogen lamps, or flash lamps. The second energy 738 generated by the light sources 736 heats a portion of the substrate 704 to an elevated temperature that is not sufficient to anneal the substrate. Thus, the light sources 736 serve as preheat energy sources. The portion of the substrate 704 treated by the second energy 738 is therefore a preheat zone 746.

In many embodiments, the first energy source 722 may be a laser capable of generating light at wavelengths readily absorbed by the substrate 704. In other embodiments, the first energy source 722 may be a flash lamp or white light source. The first energy 724 generated by the first energy source 722 heats a portion of the substrate 704 to an elevated temperature sufficient to anneal the portion of the substrate 704. Thus, the first energy source 722 serves as an anneal energy source. The portion of the substrate 704 treated by the first energy 724 is therefore an anneal zone 748.

As described above, the substrate 704 is preferably treated in portions. An actuator 750 is provided to position the first energy source 722 over an anneal region 748. A controller 752 operates the actuator 750 to position the first energy source 722 over the anneal zone 748 and operates the switching box 744 to switch power to one or more light sources 736 to direct preheat energy toward the preheat zone 746. In this way, a portion of the substrate is preheated before annealing. The controller 752 operates to move the preheat zone 746 and the anneal zone 748 together so that any portion of the substrate 704 that is annealed is first preheated, but most of the substrate 704 remains at an ambient temperature, defining an ambient zone 754.

Figure 8A:
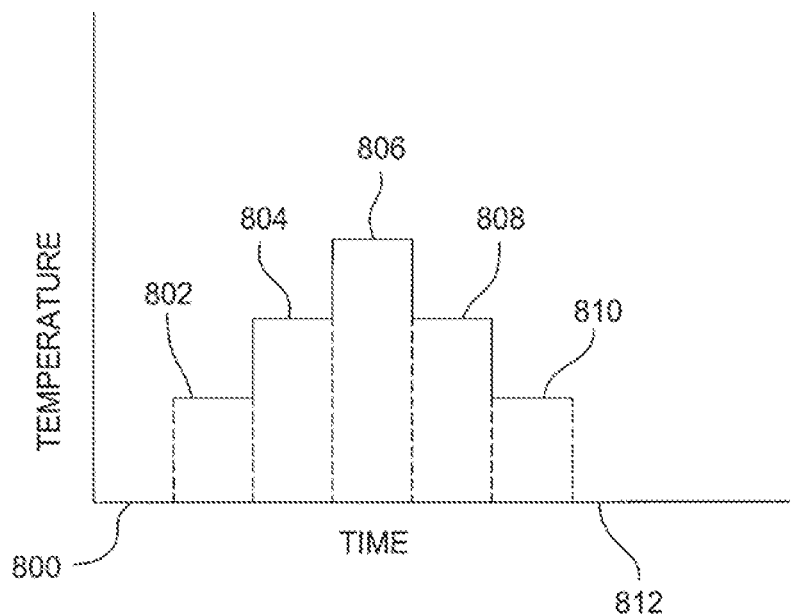
FIGS. 8A-8B are graphs of temperature versus time on substrates undergoing processes according to embodiments of the invention.
Figure 8B:
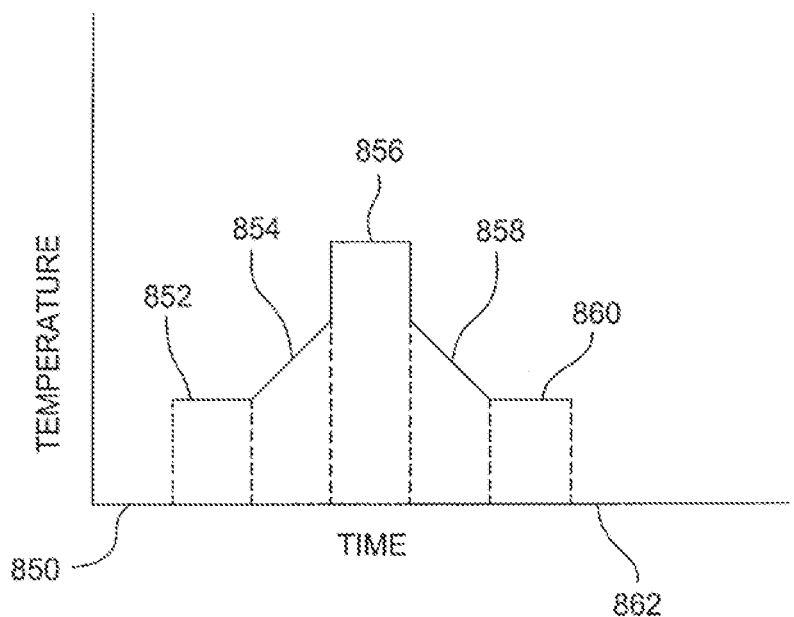

FIGS. 8A and 8B are graphs showing temperature-time profiles for two embodiments of the invention. Each graph shows the temperature of one point on the surface of a substrate undergoing thermal processing according to embodiments of the invention. As described above, the substrate moves relative to the energy sources directing energy toward the substrate surface. In FIG. 8A, as the exemplary point on the substrate surface moves from an ambient zone to a first preheat zone, the temperature of that point moves from an ambient temperature in an ambient temperature interval 800 to a first preheat temperature in a first preheat interval 802. As described elsewhere herein, the first preheat temperature is generally lower than that required to anneal the substrate surface. As the exemplary point moves from the first preheat zone to a second preheat zone, the temperature of that point moves from the first preheat temperature in the first preheat interval 802 to a second preheat temperature in a second preheat interval 804. The embodiment of FIG. 8A illustrates four zones defined on the substrate surface, an ambient zone, two preheat zones, and an anneal zone. As the exemplary point on the substrate surface moves from the second preheat zone to an anneal zone, the temperature of that point moves from the second preheat temperature in the second preheat interval 804 to an anneal temperature in an anneal interval 806. As the exemplary point moves out of the anneal zone back into lower temperature zones, it experiences cooling to the conditions of the second preheat interval 804 in a first cool-down interval 808, to the conditions of the first preheat interval 802 in a second cool-down interval 810, and finally to ambient conditions in a second ambient interval 812. It should be noted that alternate embodiments may feature temperatures during the cool-down intervals 808 and 810 that are different from those in the preheat intervals 802 and 804. Thus, the temperature in cool-down interval 808 may be higher or lower than the temperature in preheat interval 802, and the temperature in cool-down interval 810 may be higher or lower than the temperature in preheat interval 804. It should be understood that similar embodiments may feature only one preheat interval or more than two preheat intervals. Likewise, some embodiments may feature only one cool-down interval or more than two cool-down intervals.

The graph of FIG. 8B describes the temperature-time profile of one point on a substrate surface undergoing thermal processing according to another embodiment of the invention. In the embodiment of FIG. 8B, the exemplary point on the substrate surface moves from an ambient interval 850 to a first preheat interval 852, similar to the embodiment of FIG. 8A. The exemplary point then moves into a second preheat interval 854 that features a varying temperature-time profile. In this embodiment, as the exemplary point moves through the second preheat interval 854, the temperature at that point rises from a first preheat temperature to a second preheat temperature. The rise may be linear as shown in interval 854, or it may have some other profile, even including short intervals of decreasing temperature within the generally rising temperature-time profile of the second preheat interval 854. The exemplary point moves into the anneal interval 856, and then into the first cool-down interval 858, which may also have a varying temperature-time profile, much like that of the second preheat interval 854. The exemplary point then moves into the second cool-down interval 860, followed by the second ambient interval 862.

Figure 9:
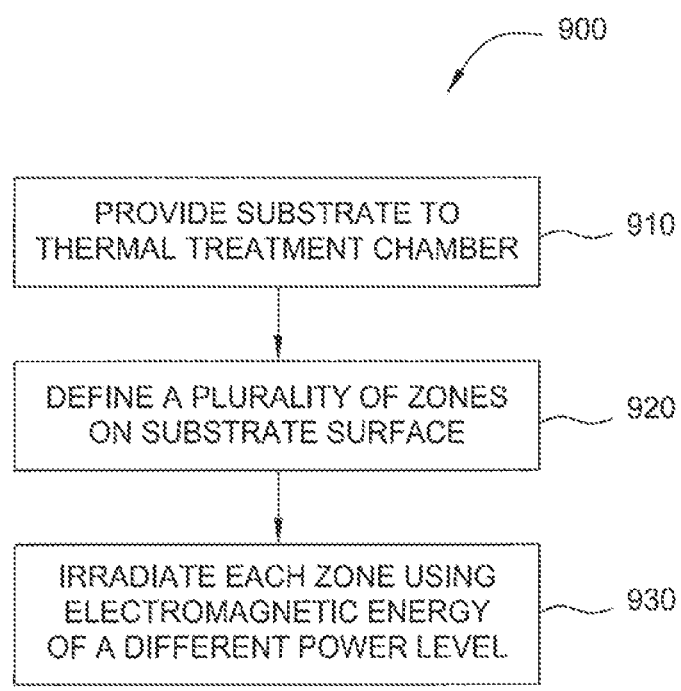
FIG. 9 is a flow diagram summarizing a method according to one embodiment of the invention.

FIG. 9 is a flow diagram showing a method 900 according to one embodiment of the invention. At 910, a substrate is provided to a thermal treatment chamber. At 920, a plurality of zones is defined on a surface of the substrate. Each zone is treated using electromagnetic energy with different levels of power. In most embodiments, there will be at least three zones, but embodiments of the invention are contemplated featuring two zones or more than three zones. In most embodiments, at least one zone will be an anneal zone, treated with electromagnetic energy selected to anneal the surface of the substrate. In some embodiments, it may be desirable to melt the substrate surface in the at least one anneal zone. In most embodiments, at least one zone will be a preheat zone. In some embodiments, one or more zones may be combined preheat and cool-down zones, whereas in other embodiments one or more zones may be exclusively preheat or cool-down zones.

In one aspect, a substrate is disposed on a substrate support, and a first quantity of electromagnetic energy is directed toward a first portion of the substrate. Additionally, a second quantity of electromagnetic energy is directed toward a second portion of the substrate, wherein the first portion of the substrate surrounds the second portion of the substrate, the first quantity of electromagnetic energy preheats the first portion of the substrate, and the second quantity of electromagnetic energy anneals the second portion of the substrate. The first quantity and second quantity are moved across the substrate, maintaining a constant spatial relationship between the two quanta of energy, such that the area of the substrate within the first and second portions moves as the energy moves.

In another aspect, the electromagnetic energy delivered in the two quanta may be of any desired nature. The energy of each quantity may be coherent or incoherent, monochromatic or polychromatic, polarized or unpolarized, and continuous or pulsed to any degree. The energy of each quantity may be delivered by one or more lasers, intense white light lamps, flash lamps, heat lamps, or combinations thereof. The two quanta of energy may be delivered by electromagnetic energy differing only in intensity, or the two quanta may differ by any desired degree in any of the characteristics mentioned above. In one example, the first quantity may be delivered by one or more lasers, each delivering at least 100 $W/cm^2$ of power at a wavelength less than about 850 nm. The lasers may be pulsed or continuous wave energy sources. In pulsed embodiments, the pulsing may be realized by cycling power to the lasers or by virtue of optical switching that intermittently blocks the laser light from leaving the optical assembly. In another example, the second quantity may be delivered by one or more lamps delivering incoherent light to the second portion at a power level of less than 50 $W/cm^2$, such as about 25 $W/cm^2$.

Figure 10:
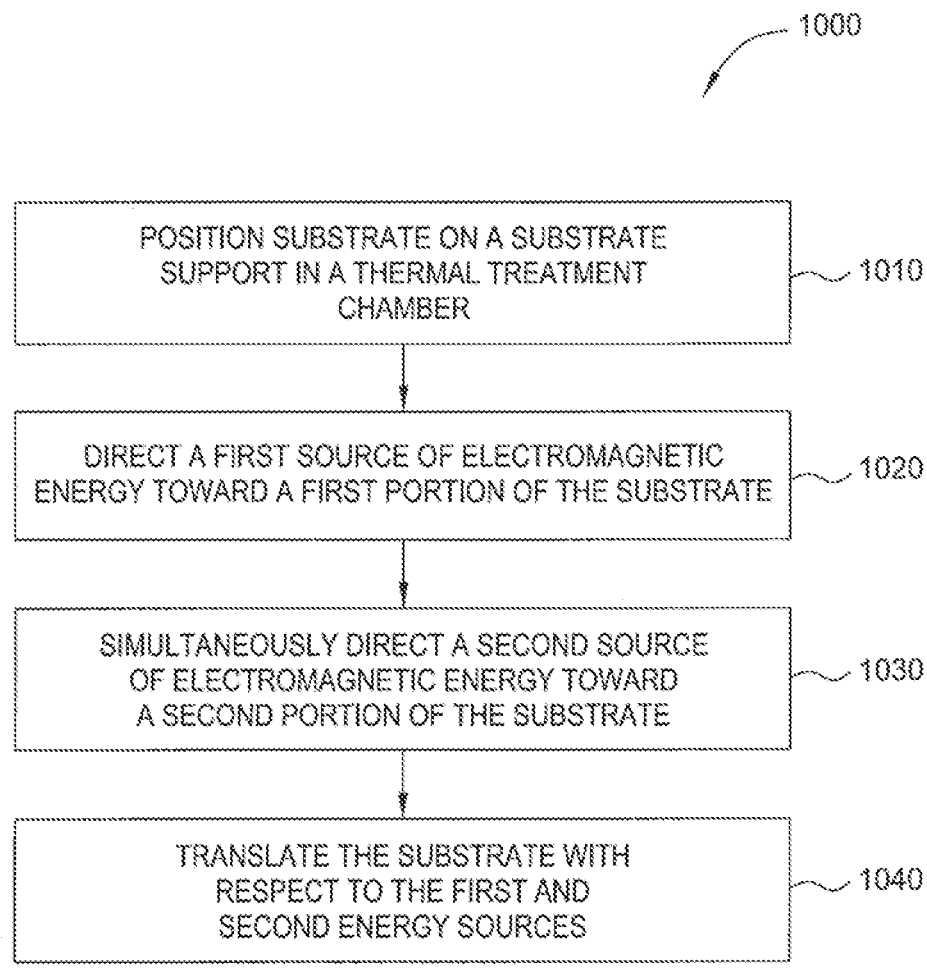
FIG. 10 is a flow diagram summarizing a method according to another embodiment of the invention.

FIG. 10 is a flow diagram summarizing a method 1000 according to another embodiment of the invention. At 1010 a substrate is positioned on a substrate support in a thermal treatment chamber. At 1020, a first source of electromagnetic energy is directed toward a first portion of the substrate. At 1030, a second source of electromagnetic energy is simultaneously directed toward a second portion of the substrate. As described elsewhere herein, one of the sources may be configured to deliver annealing energy while the other is configured to deliver preheat energy. At 1040, the substrate is translated with respect to the first and second energy sources. Translating the substrate causes the delivered energy to translate across the substrate surface to anneal the entire surface in portions. In the embodiment of FIG. 10, the energy sources are substantially stationary, while the substrate moves, but certain embodiments may feature movement of the energy sources, or the energy, in addition to movement of the substrate. Translation of the substrate is generally accomplished by using a moveable substrate support, such as a precision stage capable of positioning the substrate at a precise location within the apparatus.

In most embodiments, the zones are maintained at different temperatures. In some embodiments, the zones are heated by directing electromagnetic energy of various types and intensities toward the substrate surface. In the embodiment of FIG. 9, each zone is irradiated using electromagnetic energy of a different power level at 930. In other embodiments, additional heat may be imparted to the substrate by use of a heated substrate support contacting the back side of the substrate. In still other embodiments, portions of the substrate may be selectively cooled by a cooled substrate support contacting the back side of the substrate. The temperature in at least one of the zones will be selected to anneal the surface of the substrate. The temperature in a least one of the zones will be selected to preheat the surface of the substrate, and will be lower than that required to anneal the substrate surface. One zone, which may be an anneal zone, will receive the maximum power level. Other zones will receive lesser power levels. One or more zones, which may be preheat zones, may receive elevated power levels below that of the maximum level. Still other zones may receive negligible power, or may be cooled. Some zones may be ambient zones, wherein the temperature of the substrate is maintained at ambient temperature.

In some embodiments, the different zones may be irradiated using different sources of electromagnetic energy. One or more lasers may provide the electromagnetic energy. A first laser may generate energy to anneal a portion of the substrate in one zone, and a second laser may genereate energy to preheat a portion of the substrate in another zone. In an alternate embodiment, a plurality of lasers may preheat portions of the substrate. In another embodiment, for example the embodiment of FIG. 7, one or more heat lamps may preheat portions of the substrate.

In embodiments wherein a plurality of zones includes an anneal zone, the zones providing preheat or cool-down functions may be shaped to facilitate preheat or cool-down. In an exemplary embodiment with an anneal zone having a preheat zone on one side and a cool-down zone on an opposite side, the preheat zone and the cool-down zone may have a tapered shape, with a first edge abutting an edge of the anneal zone and coextensive with the edge of the anneal zone, and a second edge opposite the first edge and shorter than the first edge forming a trapezoidal shape. In alternate embodiments, the preheat and cool-down zones may be triangular in shape, with one edge of each coextensive with an edge of the anneal zone. In other alternate embodiments, the tapered extremity of the preheat and cool-down zones may be curved, and may be parabolic or semi-circular in some embodiments.

The plurality of zones having different temperatures and shapes generally allows for rapid annealing of the substrate by exposing portions of the substrate surface to electromagnetic energy designed to excite movement of atoms in the substrate lattice, while keeping thermal stresses below a threshold level which, if passed, would damage the substrate. The preheat and cool-down zones allow the anneal treatment to commence from an elevated temperature, speeding the ultimate temperature ramp-up and cool-down during annealing. The tapered shape of the preheat and cool-down zones may serve to minimize thermal exposure of portions of the substrate not being annealed, which minimizes unwanted movement of atoms that may have been repositioned by the anneal process, or atoms that may have been in desireable positions before the anneal process. In general, the number and shape of preheat and cool-down zones may be selected to facilitate the desired anneal process.

The embodiments described above generally feature zones having substantially constant temperature. A first zone is maintained at a first temperature, a second zone at a second temperature, and so forth. In other embodiments, one or more zones may have a temperature gradient to facilitate heating or cooling near the anneal zone. In a three-zone embodiment, for example, a first zone, which may be a preheat zone, may have a temperature gradient that increases toward a second zone, which may be an anneal zone. Likewise, a third zone, which may be a cool-down zone, may have a temperature gradient that increases toward the second zone. The temperature gradient provides the same general function as the tapered zone shape described above. A temperature gradient may be established within a given zone by use of optics to adjust the delivered energy to achieve a desired temperature profile.

In one exemplary embodiment, a single energy source of sufficient power to anneal a substrate may be oriented to direct electromagnetic energy toward the substrate. A lens having defocusing characteristics may be disposed between the energy source and the substrate. The lens may have a first portion that defocuses a corresponding first portion of the electromagnetic energy, and a second portion that either focuses a second portion of the electromagnetic energy further or leaves it unchanged. For example, if a laser is used as the source of electromagnetic energy, and shaping optics are used to form a circular annealing energy beam 2 mm in diameter, a lens may be disposed between the shaping optics and the substrate that has a circular central portion with radius 0.5 mm surrounded by a concentric annular outer portion with radius 1.5 mm. The circular central portion may have neutral optics, if desired, or may focus the portion of the annealing energy beam incident on that portion. The concentric annular outer portion of the lens may be shaped to reduce the intensity of the outer portion of the annealing energy beam. The reduced intensity energy will then impinge upon the surface of the substrate with enough power to preheat a preheat portion of the surface without annealing it, while the unchanged or focused portion anneals an anneal portion within the preheat portion.

Figure 11:
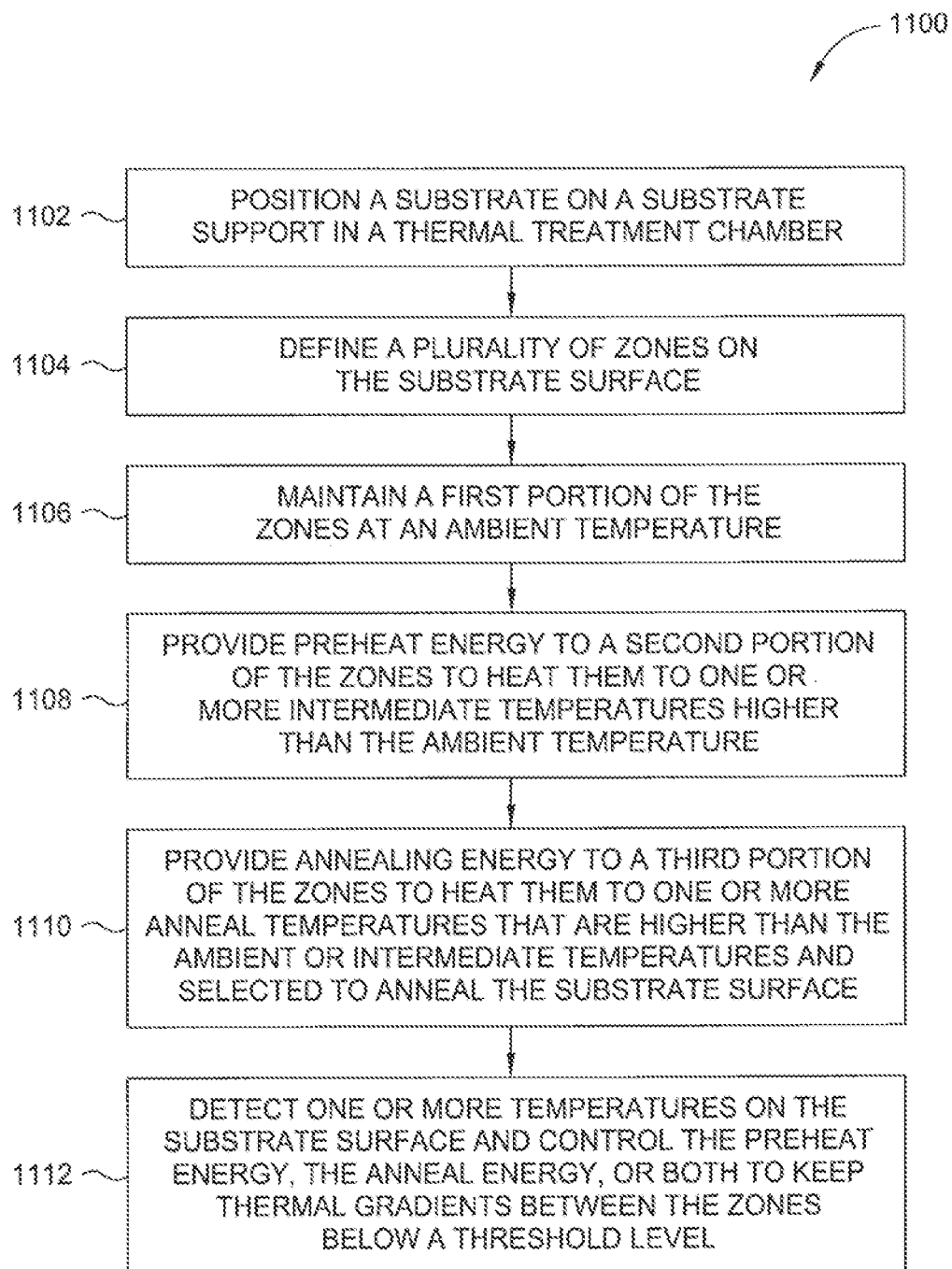
FIG. 11 is a flow diagram summarizing a method according to another embodiment of the invention.

FIG. 11 is a flow diagram summarizing a method 1100 according to another embodiment of the invention. A substrate is positioned on a substrate support in a thermal treatment chamber at 1102. A plurality of zones is defined on the substrate surface at 1104. A first portion of the zones is maintained at an ambient temperature at 1106. The ambient temperature may be room temperature in some embodiments, or it may be an elevated temperature in other embodiments. In most embodiments, the ambient temperature will be less than about 200° C., but some embodiments may feature an ambient temperature as high as 350° C. The ambient temperature may be maintained by use of a heated substrate support, or by irradiating the substrate with electromagnetic energy suitable for the desired heating.

At 1108, preheat energy is provided to a second portion of the defined zones to heat them to one or more intermediate temperatures higher than the ambient temperature. Each zone may be heated to the same intermediate temperature, or to a different intermediate temperature. Zones closer to the area to be annealed will generally be maintained at a temperature that is the same as, or higher than, that of zones further from the area to be annealed. In embodiments wherein the second portion comprises more than one zone, the intermediate temperatures may rise in a stepwise fashion from the ambient temperature to an anneal temperature. The temperature difference between an intermediate temperature and the ambient temperature will generally be between about 10% and about 90% of the temperature difference between the anneal temperature and the ambient temperature, such as between about 30% and about 70%, for example about 50%. In an exemplary embodiment wherein the second portion comprises two zones, the temperature difference between the first intermediate temperature zone and the ambient zone may be about 40% of the temperature difference between the anneal temperature and the ambient temperature, while the difference between the second intermediate temperature zone and the ambient zone is about 60% of the difference between the anneal temperature and the ambient temperature.

At 1110, annealing energy is provided to a third portion of the defined zones to heat them to one or more anneal temperatures higher than the ambient and intermediate temperatures, and selected to anneal the substrate surface. The anneal zones, comprising the third portion of defined zones, may have any of the spatial relationships described herein. Additionally, different anneal temperatures may be applied to different anneal zones, if desired.

At 1112, one or more of the foregoing temperatures may be detected and used to control delivery of the preheat energy, the anneal energy, or both to keep thermal gradients between the zones below a threshold level. In some embodiments, one or more thermal imaging devices may be used to detect the temperature of various zones. The temperature of one zone may be compared to the temperature of another zone to determine whether the thermal gradients between the zones are excessive. The energy delivered to one or more of the detected zones may be modulated based on the detected temperatures to increase or reduce the thermal gradient between those two zones. If the substrate is annealed by moving the energy sources, the detector may be co-located with the energy sources to follow the anneal and preheat zones around the substrate. If the substrate is annealed by moving only the energy (e.g. using mirrors), similar optics may be used to focus the detector on the portion of the substrate being treated, under the direction of a controller, or the entire substrate may be sampled and a computer used to determine the thermal gradients of interest.

EXAMPLES

In one exemplary embodiment, a substrate may be positioned on a support in a thermal processing apparatus. The substrate may be held in place on the support by any means known to the art, including electrostatic or vacuum means. A laser is disposed above the substrate and oriented such that it produces a beam of light that impinges the substrate in a direction substantially perpendicular to the plane of the substrate. The laser may be coupled to an optical assembly adapted to position the laser in three dimensions. The laser may be adapted to deliver laser energy of up to 10 kW/cm$^2$ to an anneal region of the substrate measuring 22 mm by 33 mm. The laser is preferably tuned to a wavelength readily absorbed by the substrate, such as less than 800 nm for a silicon substrate.

In operation, the laser may be switched using an electrical switch coupled to the power supply or an optical switch coupled to the laser or the optical assembly. The switches may be configured to switch the laser on or off in less than 1 microsecond (μsec), such that the laser can deliver pulses of energy lasting from about 1 μsec to about 10 milliseconds (msec).

For this example, a preheat light source is co-located with the laser in the optical assembly. The preheat light source may be another laser, a xenon lamp, or a heat lamp, and may be adapted to deliver up to 500 W of electromagnetic energy to a substantially circular area encompassing, and concentric with, the anneal area, and measuring about 2 cm in diameter. The preheat light source may be focused using appropriate lenses and mirrors to capture and direct all the energy of the preheat light source. The preheat light source may be located in a housing positioned close to the laser source, such that light from the preheat light source illuminates an area of the substrate encompassing the area to be annealed. The preheat light source may be angled slightly to center the preheat area around the anneal area. Alternately, the preheat light source may project energy onto the substrate substantially perpendicular to the plane of the substrate, with optics used to spread the light over a preheat region that encompasses the anneal region. The preheat light source may then be advantageously located, with respect to the laser, such that the preheat area extends further from the anneal area in the direction of the anneal path. The optical assembly may additionally be adapted to rotate such that the preheat light source maintains an advantageous position relative to the laser as the anneal path changes direction.

The processing apparatus is preferably configured to translate the substrate with respect to the optical assembly by use of a moveable stage of a type known to the art. In operation, the stage positions the substrate beneath the optical assembly such that a target area of the substrate is exposed to the optical assembly. The preheat light source may be continuously lit, illuminating the substrate with preheat energy when no anneal energy is present. The continuous preheat energy heats the surface of the substrate in an area encompassing the anneal target area to at least 600° C. The laser fires one or more pulses at the target anneal area. The pulse may be of sufficient brevity that the stage can move continuously, following an anneal path without blurring the laser pulses. The preheat region moves along the surface of the substrate as the stage moves, heating portions of the substrate to the target preheat temperature as they approach the target anneal area. Thus, the portions of the substrate immediately adjacent to the target anneal area are not subjected to damaging thermal stresses due to the high thermal gradient at the edge of the target anneal area.

In an alternate exemplary embodiment, the laser may be surrounded by two to four preheat energy sources spaced around the laser in the optical assembly. The use of multiple preheat sources allows for uniform preheating across the entire preheat area of the substrate. Alternately, the laser may be accompanied by two different preheat energy sources adapted to illuminate different areas of the substrate. One preheat energy source may, for example, be adapted to illuminate a circular area of diameter about 3 cm., which another preheat energy source illuminates a concentric circular area of diameter about 1.5 cm., concentric also with the anneal area. Thus, two preheat areas are formed. The two preheat sources may deliver similar amounts of energy, such that the source illuminating the wider area produces a smaller temperature rise than the more focused source. In one embodiment, the preheat source illuminating the broad area may heat the area to a temperature of 300° C. or more, while the preheat source illuminating the smaller area within the broad preheat area may heat the smaller area to a temperature of 700° C. or more by virtue of incremental energy. The anneal pulse can then anneal the substrate by delivering enough energy to raise the temperature of the anneal area to 1,200° C. or more without melting the substrate material.

In another exemplary embodiment, a single energy source may be used. For example, a laser may be adapted to produce a single column of light that may be used both for preheat energy and anneal energy. Optics, including mirrors, lenses, filters, and beam-splitters are generally used to tune the laser light to have a desired polarity or coherency. Such optics may also include lenses that defocus a portion of the laser light. The defocused portion of the laser light may then be directed to an area surrounding the anneal area. For example, a laser fitted with appropriate optics may produce a cylindrical beam of coherent light approximately 1 mm in diameter. The beam may be directed through a lens having a circular non-refractive central portion approximately 0.8 mm in diameter, and an annular defocusing outer portion with an inner radius of 0.8 mm and an outer radius greater than 1 mm. The portion of the laser beam passing through the non-refractive portion of the lens continues on to reach the substrate, annealing the exposed portion of the substrate, while the portion of the laser beam passing through the defocusing portion of the lens is reduced in intensity and spread over a wider area to heat that area to a lower temperature.

While the foregoing is directed to embodiments of the invention, other and further embodiments of the invention may be devised without departing from the basic scope thereof.

What is claimed is:

1. An apparatus for thermally treating a substrate, comprising:
   a movable substrate support;
   a first energy source for directing annealing energy in a rectangular shape toward a first portion of a surface of the substrate support;
   a second energy source for directing preheat energy in a tapered shape toward a second portion of the surface of the substrate support, wherein the tapered shape surrounds and overlaps the rectangular shape; and
   an optical assembly housing the first and second energy sources.

2. The apparatus of claim 1, wherein the first energy source is a laser and the second energy source is a laser.

3. The apparatus of claim 1, wherein the annealing energy has a power density of at least 1 W/cm$^2$.

4. The apparatus of claim 3, wherein the preheat energy has a power density of at least 0.1 W/cm$^2$.

5. The apparatus of claim 1, wherein the optical assembly further comprises a first optical tuner to shape the annealing energy and a second optical tuner to shape the preheat energy.

6. The apparatus of claim 1, further comprising a controller coupled to the substrate support.

7. The apparatus of claim 1, wherein the second energy source comprises a plurality of light sources disposed around the first energy source.

8. The apparatus of claim 1, further comprising an actuator to rotate the optical assembly.

9. An apparatus for thermally treating a substrate, comprising:
   a movable substrate support;
   a first energy source for directing annealing energy in a rectangular shape toward a first portion of a surface of the substrate support;
   a second energy source for directing preheat energy in a triangular shape toward a second portion of the surface of the substrate support, wherein the triangular shape surrounds and overlaps the rectangular shape;
   a third energy source for directing a thermal energy in a zoned shape toward a third portion of the surface of the substrate support, wherein the zoned shape surrounds the triangular shape and has a temperature gradient that increases toward the triangular shape; and
   an optical assembly housing the first and second energy sources.

10. The apparatus of claim 9, wherein the first energy source is a laser and the second energy source is a laser.

11. The apparatus of claim 9, wherein the annealing energy has a power density of at least 1 W/cm$^2$.

12. The apparatus of claim 11, wherein the preheat energy has a power density of at least 0.1 W/cm$^2$.

13. The apparatus of claim 9, wherein the optical assembly further comprises a first optical tuner to shape the annealing energy and a second optical tuner to shape the preheat energy.

14. The apparatus of claim 9, wherein the second energy source comprises a plurality of light sources disposed around the first energy source.

15. An apparatus for thermally treating a substrate, comprising:
- a movable substrate support;
- a first energy source for directing shaped annealing energy in a rectangular shape toward a first portion of a surface of the substrate support, wherein the first portion is maintained at a first temperature;
- a second energy source for directing shaped preheat energy in a tapered shape toward a second portion of the surface of the substrate support, wherein the second portion is maintained at a second temperature that is different from the first temperature, wherein the tapered shape surrounds and overlaps the rectangular shape; and
- an optical assembly housing the first and second energy sources.

16. The apparatus of claim 15, wherein the first energy source is a laser and the second energy source is a laser.

17. The apparatus of claim 15, wherein the annealing energy has a power density of at least 1 W/cm$^2$.

18. The apparatus of claim 15, wherein the preheat energy has a power density of at least 0.1 W/cm$^2$.

19. The apparatus of claim 15, wherein the optical assembly further comprises a first optical tuner to shape the annealing energy and a second optical tuner to shape the preheat energy.

20. The apparatus of claim 15, wherein the second energy source comprises a plurality of light sources disposed around the first energy source.

* * * * *